US006909642B2

(12) United States Patent
Lehmann et al.

(10) Patent No.: US 6,909,642 B2
(45) Date of Patent: Jun. 21, 2005

(54) SELF TRIMMING VOLTAGE GENERATOR

(75) Inventors: Gunther Lehmann, Munich (DE);
Gerd Frankowsky,
Hoehenkirchen-Siegertsbrunn (DE)

(73) Assignee: Infineon Technologies North American Corp., San Jose, CA (US)

( * ) Notice: Subject to any disclaimer, the term of this patent is extended or adjusted under 35 U.S.C. 154(b) by 92 days.

(21) Appl. No.: 10/387,435

(22) Filed: Mar. 14, 2003

(65) Prior Publication Data

US 2004/0179417 A1 Sep. 16, 2004

(51) Int. Cl.$^7$ .................................................. G11C 7/00
(52) U.S. Cl. ............................. 365/189.09; 365/189.07; 365/201
(58) Field of Search ........................... 365/201, 189.07, 365/189.09; 323/316; 327/540

(56) References Cited

U.S. PATENT DOCUMENTS

| | | | | |
|---|---|---|---|---|
| 5,841,271 A | * | 11/1998 | Nakayama | 323/316 |
| 6,008,674 A | * | 12/1999 | Wada et al. | 327/89 |
| 6,788,132 B2 | * | 9/2004 | Lim et al. | 327/540 |
| 2001/0004126 A1 | * | 6/2001 | Onlhoff | 257/528 |
| 2004/0022115 A1 | * | 2/2004 | Park et al. | 365/226 |

* cited by examiner

Primary Examiner—Vu A. Le
(74) Attorney, Agent, or Firm—Morrison & Foerster LLP

(57) ABSTRACT

Described are integrated circuit chips that are capable of self-adjusting an internal voltage of the integrated circuit chip and methods for adjusting the internal voltage of an integrated circuit chip. The methods include comparing an internally generated voltage to an external target voltage.

17 Claims, 5 Drawing Sheets

SELF TRIMMING VOLTAGE GENERATOR

FIELD OF THE INVENTION

The present invention relates to an arrangement for trimming the internal voltages produced by an integrated circuit.

BACKGROUND

Modern integrated circuits chips such as Dynamic Random Access Memory (DRAM) chips have many different voltages that have to be generated on the chip by a plurality of generators. Each of the generators is manufactured to provide a specific voltage to the integrated circuit. However, due to variations in the manufacturing process the actual voltage provided by each generator can initially vary outside of an acceptable range. To correct these variations the voltage generators on integrated circuits often are trimmed to provide an internal voltage within the acceptable range.

FIG. 1 shows a conventional scheme for trimming the voltage of a voltage generator on an integrated circuit chip 100. Integrated circuit chip 100 includes a voltage generator 102, a test-mode controller 104, and a test-pad 106. The voltage generator 102 produces an internal voltage 108 from an external voltage 110. The voltage generator can include, for example, a voltage divider or voltage pump that produces an internal voltage 108 that is less than or greater than the external voltage 110. The internal voltage 108 can be distributed to an integrated circuit via electrical connection 112. The integrated circuit can include, for example, a memory array. The internal voltage 108 is also distributed to a test-pad 106 via electrical connection 114.

To trim the internal voltage, the internal voltage 108 is distributed to an external tester 118 through an electrical connection 116 made between the external tester 118 and test-pad 106. The external tester 118 determines the value of the internal voltage 108. If the internal voltage 108 needs to be trimmed, the external tester 118 sends tester signal 120 to test-mode controller 104. Test-mode controller 104 translates the tester signal 120 into control signals 122 for adjusting voltage generator 102. The adjustments to voltage generator 102 modifies the internal voltage 108 produced by the voltage generator 102.

The internal voltage 108 is continually modified until it is within a predetermined range. Once the internal voltage is within the predetermined range, the trim adjustments made to voltage generator 102 can be made permanent by programming the status of the control signals on the integrated circuit accordingly. Permanent programming can be accomplished, for example, by the setting of non-volatile storage elements residing on the integrated circuit. These storage elements can include, for example, laser fuses (which are fuses that are programmed by an external laser beam) or electrical fuses that are programmed by an electrical signal.

In the conventional scheme for trimming the internal voltage of an integrated circuit chip an external tester is used to measure each internal voltage and then to relay this information back to the chip. Because the external tester must typically measure each voltage individually, it is difficult to trim multiple internal voltages simultaneously without using a complicated external tester. Since modern integrated circuit chips, like DRAMs, often include multiple internal voltages a voltage generator scheme which can allow multiple internal voltages to be simply and efficiently trimmed simultaneously is desirable. Also, in the conventional scheme, the simultaneous testing of multiple integrated circuit chips is limited because the external tester can not typically share the control and measurement signals for more than one chip. Each voltage on each chip must be measured independently. Furthermore, the trimming information must be supplied to each chip individually. Accordingly, a voltage generator scheme which allows for the simultaneous trimming of multiple integrated circuits chips is desirable to increase the efficiency of the trimming process.

SUMMARY OF THE INVENTION

This invention relates to integrated circuit chips that are capable of self-adjusting an internal voltage of the integrated circuit chip and methods for adjusting the internal voltage of an integrated circuit chip.

In one embodiment, the integrated circuit chip includes a voltage generator that produces an internal voltage, a comparator for comparing an externally supplied voltage to the internal voltage and a control circuit that provides signals for adjusting the internal voltage.

Preferably, the integrated circuit chip includes a memory array. Preferably, the memory array is a dynamic random access memory (DRAM) array. Preferably, the control circuit provides signals for adjusting the internal voltage after receiving a signal from the comparator and after the integrated circuit has received a test signal from an external source.

Preferably, the voltage generator is a voltage pump or a voltage divider. Preferably, the control circuit comprises a Built In Self Test (BIST) controller, wherein the BIST controller activates the circuit while providing signals for adjusting the internal voltage.

In another embodiment the integrated circuit chip includes a plurality of voltage generators, a plurality of comparators for comparing externally supplied voltages to voltages generated by the voltage generators and a control circuit that provides signals for adjusting the voltages generated by the voltage generators. Preferably, the voltages generated by the voltage generators are adjusted by signals provided by the control circuit concurrently.

In one embodiment the method of adjusting an internal voltage of an integrated circuit chip includes supplying an external voltage to a comparator on the integrated circuit chip, supplying an internal voltage to the comparator, comparing the external voltage to the internal voltage and adjusting the internal voltage depending upon the comparison between the internal voltage and the external voltage. Preferably, the internal voltage is adjusted after the integrated circuit chips receives a test signal from an external source.

Another embodiment is a method of adjusting internal voltages of an integrated circuit chip by supplying a plurality of external voltages to a plurality of comparators on an integrated circuit chip, supplying a plurality of internal voltages to the comparators, comparing the external voltages to the internal voltages and varying the internal voltages depending upon the comparisons between the internal voltages and the external voltages.

Yet another embodiment is a method of adjusting internal voltages of a plurality of integrated circuit chips by supplying an external voltage to a plurality of integrated circuit chips, generating a plurality of internal voltages, comparing the external voltage to the internal voltages and adjusting the internal voltages depending upon the comparison between the internal voltage and the external voltage. Preferably, the internal voltages are adjusted after the integrated circuit chips receive a test signal from an external source that is distributed to the integrated circuit chips.

BRIEF DESCRIPTION OF THE DRAWINGS

The invention will be better understood by reference to the Detailed Description of the Invention when taken together with the attached drawings, wherein.

DETAILED DESCRIPTION OF THE INVENTION

Described with reference to FIGS. 2 through 5 are self-adjusting generator schemes for trimming the internal voltages of an integrated circuit chip. The self-adjusting generator schemes allows for an integrated circuit chip to adjust the internal voltage provided by one or more voltage generators when an external target voltage or target voltages are applied to the chip.

Figure 1:
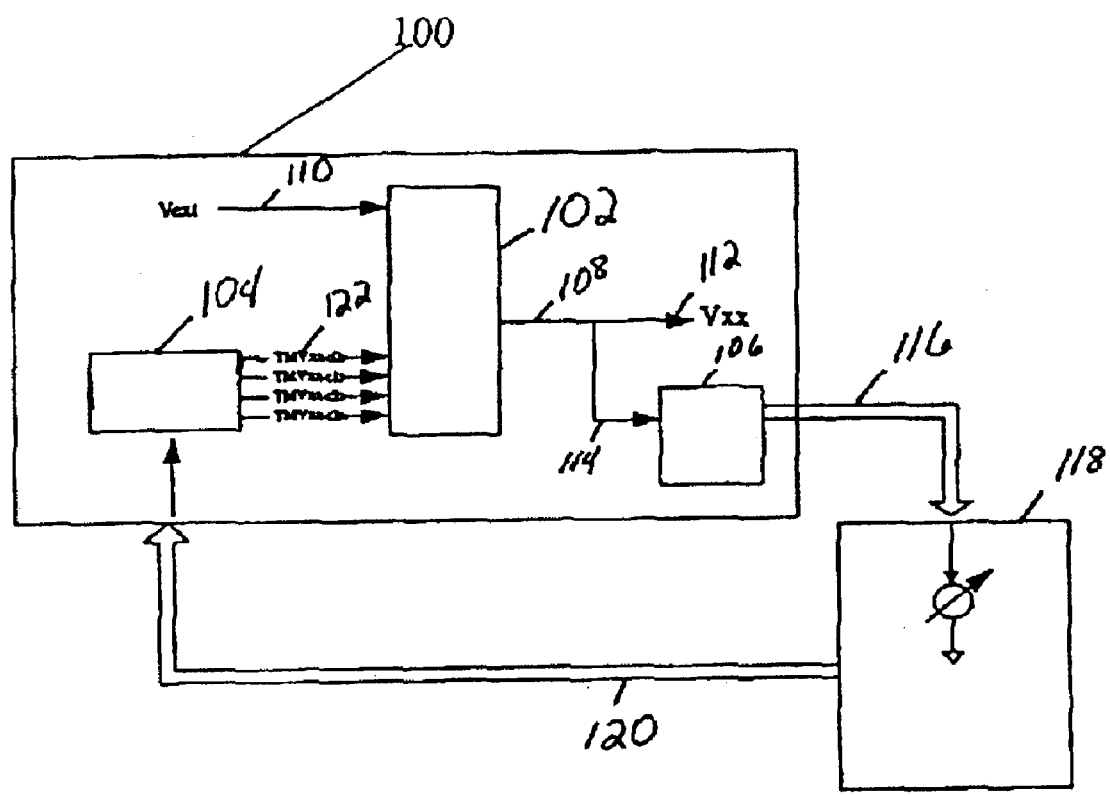
FIG. 1 is a conventional scheme for trimming the voltage of a voltage generator on an integrated circuit chip.
Figure 2:
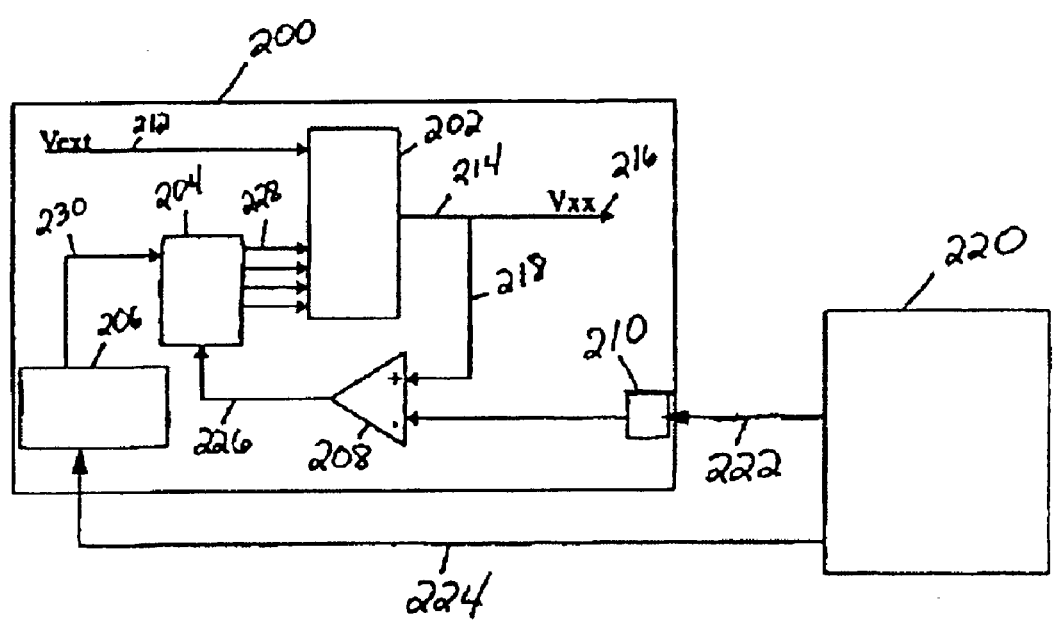
FIG. 2 is a self-trimming voltage scheme for trimming the voltage of a voltage generator on an integrated circuit chip.

FIG. 2 shows one embodiment of a self-adjusting generator system for trimming the voltage of a voltage generator on an integrated circuit chip 200. Integrated circuit chip 200 includes a voltage generator 202, a control circuit 204, a test-mode controller 206, a comparator 208 and a test-pad 210. The voltage generator 202 produces an internal voltage 214 from an external voltage 212. The voltage generator can include, for example, a voltage divider or a voltage pump that produces an internal voltage 214 that is less than or greater than the external voltage 212. The internal voltage 214 can be distributed to an integrated circuit via electrical connection 216. A preferred electrical circuit is a memory array, more preferably a DRAM array.

The internal voltage 214 is also distributed to a comparator 208 through electrical connection 218. A test-pad 210 is also electrically connected to comparator 208. To trim the internal voltage, an external target voltage 222 is applied to the test-pad 210 using an external tester 220. The target voltage 222 has a predetermined value. The target voltage 222 is distributed to comparator 208, where it is compared to internal voltage 214. Comparator 208 sends a compare signal 226 to control circuit 204. Preferably, compare signal 226 indicates whether the internal voltage 214 is higher, lower or equal to target voltage 222. If the internal voltage 214 is too high or too low, the control circuit 204 adjusts the voltage generator 202 using control signals 228. The adjustments made to voltage generator 202 are stored temporarily in a volatile memory. Examples of such a memory are SRAM circuits or registers being implemented with flip-flops. Once a final and sufficient setting of the control signals is found, this setting can be programmed permanently in a non-volatile memory on the integrated circuit chip. For example, such a non-volatile memory could be implemented with laser fuses, electrical fuses or ferro-electric memory cells.

Preferably, the self-adjusting generator scheme includes a test-mode controller 206. Test-mode controller 206 receives an external test signal 226 from external tester 220. Upon receiving the external test signal 226, the test-mode controller 206 sends a test-mode signal 230 to control circuit 204, which then begins adjusting the voltage generator 202.

The control circuit 204 can adjust the internal voltage in a variety of ways. For example, in one embodiment, the control circuit 204 includes a simple binary counter. In this embodiment, the binary counter begins when the control circuit 204 receives the test-mode signal 206. Each binary number represents a different adjustment that is made to voltage generator 202. The binary counter can then be stopped when the control circuit 204 receives a compare signal 226 that indicates that the internal voltage 218 is the same as the target voltage 222. In this embodiment, the control circuit would utilize up to $N^2$ steps to adjust the voltage of voltage generator 202 (where N=number of control signals 228).

The control circuit 204 can also include a Built In Self Test (BIST) controller. The BIST controller can activate the integrated circuit and initiate the execution of operations in the integrated circuit. Those operations can be for example, read data operations, write data operations, or arithmetic operations like multiplication. The operations will cause a voltage drain via electrical connection 216. Consequently, the BIST can simulate an active integrated circuit. In this manner, the BIST controller can take into account the influence of the integrated circuit on the internal voltage 214 during the adjustment of voltage generator 202.

Figure 3:
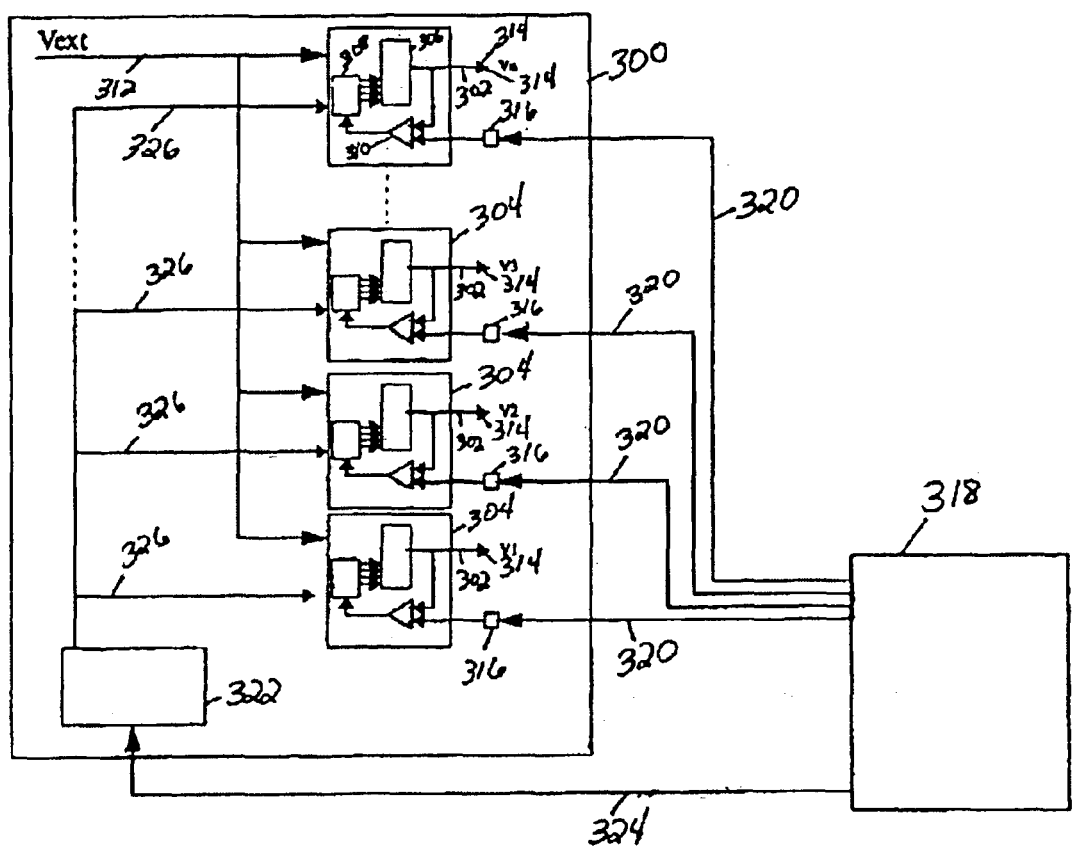
FIG. 3 is a self-trimming voltage scheme in which several voltage generators on an integrated circuit chip are trimmed simultaneously.

FIG. 3 shows an embodiment of a self-adjusting generator system for trimming multiple voltages produced by multiple voltage generators on an integrated circuit chip 300. Integrated circuit chip 300 includes multiple internal voltages 302. The internal voltages can be adjusted to one or more different values or can be adjusted to the same value according to this scheme. An internal voltage adjustment circuit 304 adjusts each internal voltage 302. Each internal adjustment circuit 304 includes a voltage generator 306, a control circuit 308 and a comparator 310. As described with respect to the embodiment shown in FIG. 2, the voltage generators 306 can include, for example, a voltage divider or a voltage pump that produces an internal voltage 302 from one or more external voltages 312. The internal voltages 302 can be distributed to an integrated circuit, such as a DRAM array, via electrical connections 314.

Each internal voltage 302 is also distributed to a comparator 310. Internal voltage adjustment circuits 304 that are to be trimmed to provide the same internal voltages 302 can share the same test-pad 316 or each internal voltage adjustment circuit 304 can be provided its own test-pad 316. The test-pads 316 are electrically connected to comparators 310 of internal voltage adjustment circuits 304. To trim the internal voltages, an external target voltage 320 is applied to each test-pad 316 using an external tester 318. The external target voltages 320 each have a predetermined value corresponding to an internal voltage 314. As described in reference to the scheme described in FIG. 2, the target voltages 320 are each distributed to a comparator 310, where they are compared to an internal voltage 302. Comparators 310 then send a compare signal to control circuits 308. The control circuits 308 adjust the voltage generators 306 in accordance with the compare signal. The adjustments made to voltage generators 306 can be made permanent in the same manner described with respect to FIG. 2.

This self-adjusting generator scheme includes a single test-mode controller 322. The test-mode controller 322 receives an external test signal 324 from external tester 318. Upon receiving the external test signal 324, the test-mode controller 326 sends a test-mode signal 326 to each control circuit 308 to initiate the process of adjusting the voltage generators 306.

This voltage adjustment scheme allows for multiple voltage generators 306 to be efficiently adjusted at the same time. The simultaneous trimming of more than one internal voltage can reduce the time required to trim an integrated circuit.

Figure 4:
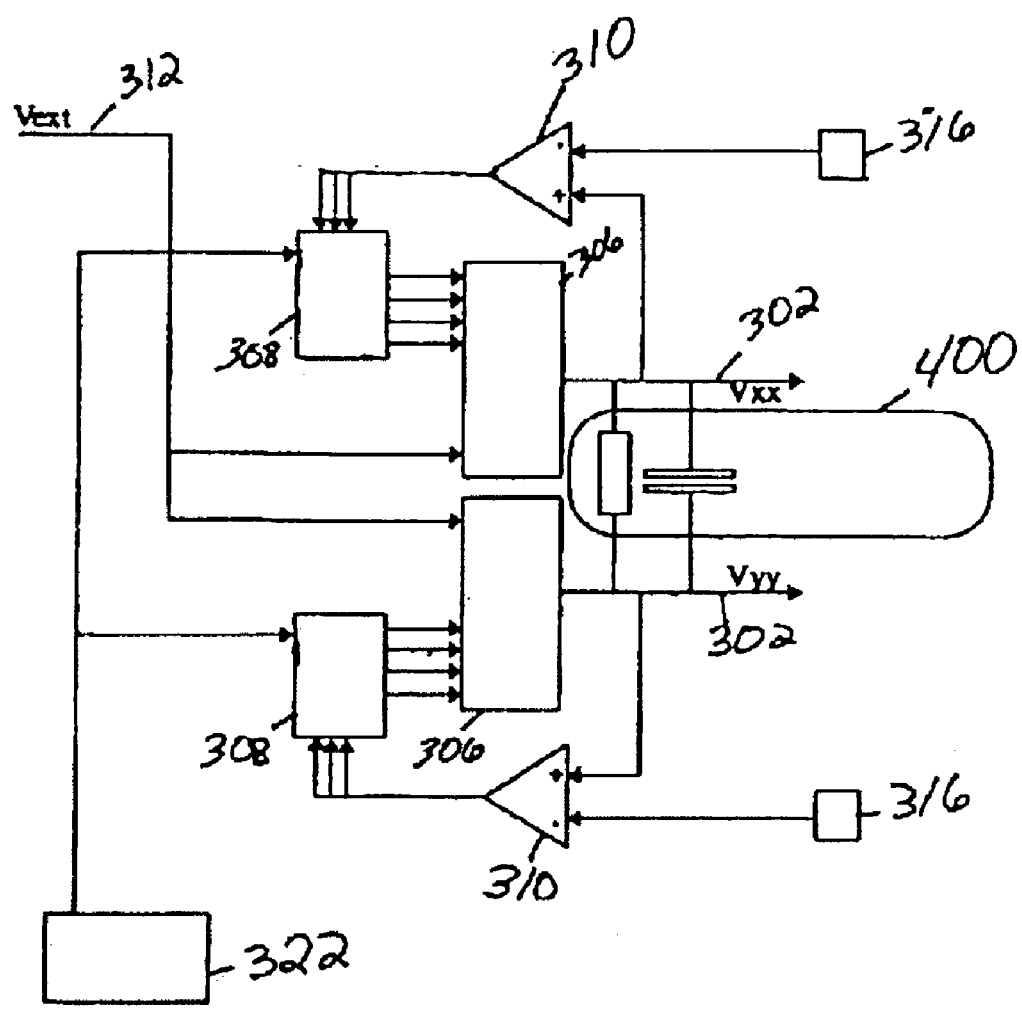
FIG. 4 is a self-trimming voltage scheme in which voltage generators on an integrated circuit chip are trimmed at the same time and in which coupling effects between the voltage generators are taken into account.

FIG. 4 shows a particular embodiment of the self-adjusting generator system described with reference to FIG. 3. In FIG. 4 the internal voltages 302 are provided to the same integrated circuit 400. In this embodiment one internal voltage 302 is coupled to another internal voltage 302 through the integrated circuit 400. Accordingly, the adjustment of one internal voltage 302 can effect one or more other internal voltages 302.

Preferably, the voltage generators 306 are adjusted while the integrated circuit 400 is active. If the integrated the integrated circuit comprises a memory array, such as a DRAM array, preferably the voltage generators 306 are adjusted while circuit operations, for example, reading data, writing data, precharging a bank, or executing a refresh are performed. By allowing the trimming of multiple internal voltages 302 simultaneously while the chip is active, this self-trimming adjustment scheme allows for more accurate trimming of the internal voltages 302 by taking into account coupling effects that can occur between the internal voltages 302 of an integrated circuit chip 300.

Figure 5:
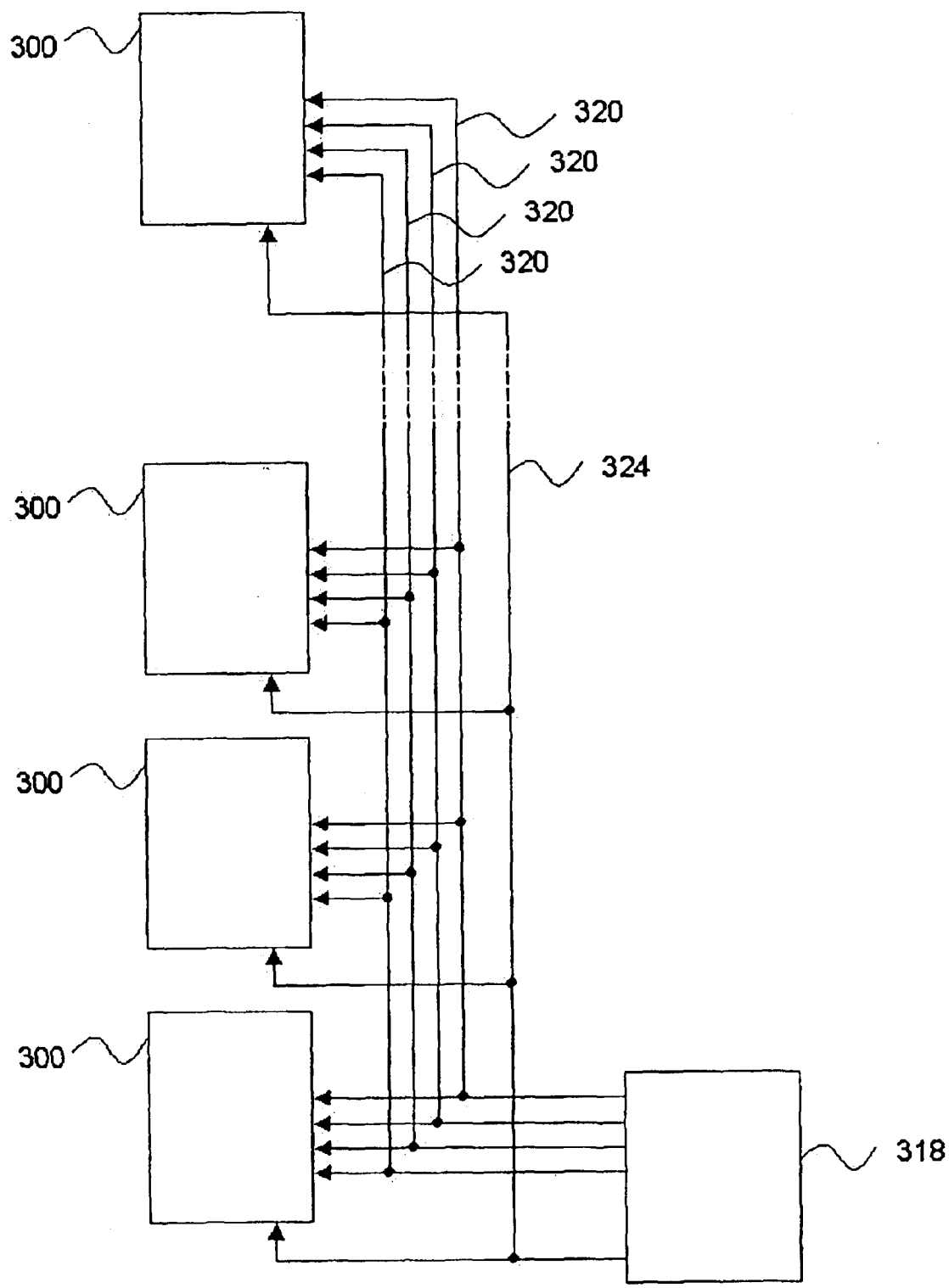
FIG. 5 is a self-trimming voltage scheme in which several voltages on several integrated circuit chips are trimmed simultaneously.

FIG. 5 shows another embodiment of a self-trimming voltage generator scheme utilizing the system described in FIG. 3. In FIG. 5, an external tester 318 supplies an external target voltage 320 to a plurality of integrated circuit chips 300. In addition, an external test signal 324 is distributed to all of the integrated circuit chips 300. Since all of the integrated circuit chips are typically adjusted to the same set of reference voltages, the external target voltages 320 generated by the external tester can be shared between the integrated circuit chips 300. By sharing the signal 324, all the integrated circuits connected to the external tester can execute the trimming of their respective internal voltages simultaneously. Consequently, compared to conventional methods, the time for trimming can be reduced. For example, if 20 integrated circuit chips 300 are trimmed in parallel, the time required for trimming can be reduced by a factor of 20.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

What is claimed is:

1. An integrated circuit chip, comprising:
   a plurality of voltage generators;
   a plurality of comparators for comparing externally supplied voltages to voltages generated by the voltage generators; and
   a control circuit that provides signals for adjusting the voltages generated by the voltage generators to obtain predetermined constant internal voltages.

2. The integrated circuit chip of claim 1, wherein the voltages generated by the voltage generators are adjusted by signals provided by the control circuit concurrently.

3. The integrated circuit chip of claim 1, further comprising a memory array.

4. The integrated circuit chip of claim 3, wherein the memory array is a dynamic random access memory (DRAM) array.

5. The integrated circuit chip of claim 1, wherein the control circuit provides signals for adjusting the voltages generated by the voltage generators after receiving a signal from at least one of the comparators and after the integrated circuit has received a test signal from an external source.

6. The integrated circuit chip of claim 1, wherein the voltage generators are voltage pumps or voltage dividers.

7. The integrated circuit chip of claim 1, wherein the control circuit comprises a Built In Self Test (BIST) controller, wherein the BIST controller activates the circuit while providing signals for adjusting the voltages generated by the voltage generators.

8. A method of adjusting internal voltages of an integrated circuit chip comprising:
   supplying a plurality of external voltages to a plurality of comparators on an integrated circuit chip;
   supplying a plurality of internal voltages to the comparators;
   comparing the external voltages to the internal voltages; and
   varying the internal voltages depending upon the comparisons between the internal voltages and the external voltages to obtain predetermined constant internal voltages.

9. The method of claim 8, wherein the integrated circuit comprises a memory array.

10. The method of claim 9, wherein the memory array is a dynamic random access memory (DRAM) array.

11. The method of claim 9, wherein the internal voltages are adjusted after the integrated circuit chip receives a test signal from an external source.

12. The method of claim 9, wherein the integrated circuit chip comprises a Built In Self Test (BIST) controller, wherein the BIST controller activates an integrated circuit while providing signals for adjusting the internal voltages.

13. A method of adjusting internal voltages of a plurality of integrated circuit chips comprising:
   supplying an external voltage to a plurality of integrated circuit chips;
   generating a plurality of internal generated voltages;
   comparing the external voltage to the internal voltages; and
   adjusting the internal voltages depending upon the comparison between the internal voltage and the external voltage to obtain predetermined constant internal voltages.

14. The method of claim 13, wherein the internal voltages are adjusted after the integrated circuit chips receive a test signal from an external source that is distributed to the integrated circuit chips.

15. The method of claim 13, wherein the integrated circuit chips comprise memory arrays.

16. The method of claim 15, wherein the memory arrays are dynamic random access memory (DRAM) arrays.

17. The method of claim 13, wherein the integrated circuit chips comprise a Built In Self Test (BIST) controller, wherein the BIST controller activates an integrated circuit while providing signals for adjusting an internal voltage.

* * * * *